US008035221B2

United States Patent
Cruz

(10) Patent No.: US 8,035,221 B2
(45) Date of Patent: Oct. 11, 2011

(54) CLIP MOUNT FOR INTEGRATED CIRCUIT LEADFRAMES

(75) Inventor: Randolph Cruz, Melbourne, FL (US)

(73) Assignee: Intersil Americas, Inc., Milpitas, CA (US)

(*) Notice: Subject to any disclaimer, the term of this patent is extended or adjusted under 35 U.S.C. 154(b) by 174 days.

(21) Appl. No.: 12/250,525

(22) Filed: Oct. 13, 2008

(65) Prior Publication Data

US 2009/0121330 A1    May 14, 2009

Related U.S. Application Data

(60) Provisional application No. 60/986,579, filed on Nov. 8, 2007, provisional application No. 60/990,280, filed on Nov. 26, 2007.

(51) Int. Cl.
*H01L 23/12* (2006.01)

(52) U.S. Cl. ............. 257/704; 257/E23.031; 257/676; 257/690; 438/106; 438/125

(58) Field of Classification Search ........... 257/E23.031, 257/E21.001, 676, 690, 691, 704, 706, 707, 257/710, 726, 727, 778, 779; 438/106, 121, 438/123, 661, 125; 174/263

See application file for complete search history.

(56) References Cited

U.S. PATENT DOCUMENTS

| | | | |
|---|---|---|---|
| 5,779,488 A * | 7/1998 | Cluff | 439/73 |
| 6,582,100 B1 * | 6/2003 | Hochstein et al. | 362/294 |
| 6,630,726 B1 * | 10/2003 | Crowley et al. | 257/666 |
| 6,873,041 B1 * | 3/2005 | Crowley et al. | 257/692 |
| 7,238,551 B2 * | 7/2007 | Kasem et al. | 438/123 |
| 7,394,150 B2 * | 7/2008 | Kasem et al. | 257/690 |
| 7,495,323 B2 * | 2/2009 | St. Germain et al. | 257/676 |
| 2006/0108671 A1 * | 5/2006 | Kasem et al. | 257/676 |
| 2006/0110856 A1 * | 5/2006 | Kasem et al. | 438/123 |
| 2009/0121330 A1 * | 5/2009 | Cruz | 257/676 |

* cited by examiner

*Primary Examiner* — Chris Chu
(74) *Attorney, Agent, or Firm* — Wallace G. Walter

(57) ABSTRACT

A leadframe having a die thereon connects a high current conductive area on the die to a leadframe contact using a copper clip that include a structural portion that is received within a recess-like "tub" that is formed in the leadframe contact which tub is shaped to conform to the geometric shape of the clip. In the preferred embodiment, a leadframe structure fabricated by etching includes at least one contact that is a halfetch recess or "tub" that receives one end of the clip structure and is retained in the tub by an adhesive. The end of the clip that is received in the tub is held in place during subsequent handling until the clip and leadframe undergo solder reflow to effect an electrical connection sufficient to handle the current load and also effect a reliable mechanical connection.

5 Claims, 4 Drawing Sheets

CLIP MOUNT FOR INTEGRATED CIRCUIT LEADFRAMES

CROSS-REFERENCE TO RELATED APPLICATION

This patent application claims the benefit of commonly owned U.S. Provisional Patent Application 60/986,579 filed Nov. 8, 2007 by the inventor herein and entitled "Clip Mount For Integrated Circuit Leadframes" and commonly owned U.S. Provisional Patent Application 60/990,280 filed Nov. 26, 2007 by the inventor herein and entitled "Self-Aligning Structures For Integrated Circuits," the respective disclosures of which are incorporated herein by reference.

BACKGROUND OF THE INVENTION

The present invention relates to the electrical connection of an integrated circuit (i.e., "die") with its surrounding leadframe structure and, more particularly, to connections designed to carry currents much higher than that normally associated with conventional bonding wires or groups of bonding wires.

In the packaging of integrated circuits, the "chip" or die is typically attached to the die "paddle" or "pad" portion of a leadframe structure by a die-attach adhesive or material, typically a solder paste created as a mixture of solder particles and a flux-containing gel. The die includes contact pads that are electrically connected to respective leads or contact areas on the leadframe by thin bonding wires using ball bond (i.e., "nail-head") or wedge bond formations and thermocompressive or thermosonic bonding techniques.

In some applications involving higher than usual currents, a plurality of bonding wires can be used to connect various conductive pads on the die to leads, pads, or contact areas on the leadframe to accommodate the current involved. As the current levels increase, the number of bonding wire connections increases to the point where the use of a sufficient plurality of bonding wires to carry the current load becomes impracticable. Rather than use a multitude of bonding wires in high-current applications, such as those involving power-switching or power-handling transistors, connections can be made from the die to the leadframe via a conductive ribbon or pre-formed shape-sustaining clips using copper or a copper alloy, for example, as the conductive material. In those cases where a pre-formed clip is used, a need arises for maintaining the clip in place during processing.

SUMMARY

A clip structure is mounted to a leadframe using a "tub" that is formed in the leadframe material and shaped to substantially conform to the geometric shape of the clip at the end thereof that connects to the leadframe. In the preferred embodiment, a leadframe structure is fabricated by etching with at least one portion thereof including a half-etch pocket, groove, recess, trench, or "tub" that receives one end of the clip structure and is retained in the tub by an adhesive material, such as a solder paste. Thus, the end of the clip that is received in the tub is held in place in the x,y,z planes during subsequent handling until the clip and leadframe undergo a solder reflow step. During the solder reflow step, the adhesive solder paste is thermally liquefied and thereafter solidified to effect an electrical connection sufficient to handle the current load and a provide a reliable mechanical connection.

In a preferred embodiment, the tub is formed as a substantially rectangular prism or parallelepiped dimensioned to accept the similarly shaped end of a conductive copper clip with the clip held in place by a close clearance fit, a dimensional line-to-line fit, or by an adhesive material where a clearance dimension is designed into the mating parts.

In a variation of the preferred embodiment, the tub can be larger than the clip in at least one dimension to accommodate irregularities on the clip structure or in the clip-receiving tub.

The use of a tub into which part of the clip is received increases device reliability by providing a recess-like tub that contains the adhesive material in place and prevents migration outside of the confines of the tub onto or into adjacent areas; migration of the adhesive material beyond the as-designed area where no tub is used can cause electrical short circuits, cross-circuit paths, and paths for the ingress of moisture after encapsulation. The use of a tub increases the opportunity to place more solder paste into the tub where solder joint standoff techniques are used; i.e., where that portion of the clip received within the tub "stands" on a pad of solder to reduce failures due to solder-joint connection fatigue. The use of a tub also reduces issues related to clip "swimming" or misalignment by virtue of the presence of the tub walls that confine movement of the clip during the solder reflow step.

DESCRIPTION OF THE PREFERRED EMBODIMENTS

Figure 1:
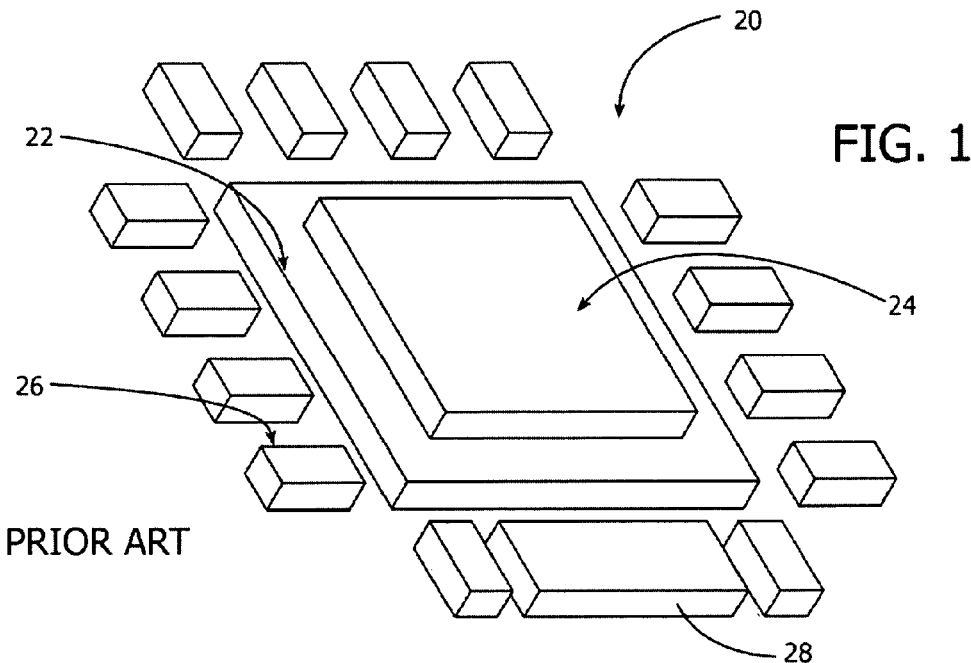
FIG. 1 is an isometric view of an example or representative leadframe having a die attached thereto.

FIG. 1 illustrates an idealized example of a leadframe and die structure of the prior art and is designated generally therein by the reference character 20. The leadframe includes a die pad or "paddle" 22 upon which a die 24 (represented as a simple rectangular prism) is attached, usually by some type of die-attach adhesive (such as a solder paste). A plurality of contacts 26 surround the paddle 22 including a contact 28 that is substantially wider than the others. Conductive pads or lands (not shown) on the die 24 are electrically connected to the various contacts by bonding wires (not shown) and are secured in place at their respective ends on their respective pads or lands by suitable bonding techniques including, for example, thermocompression or thermosonic techniques or variants thereof.

Figure 2:
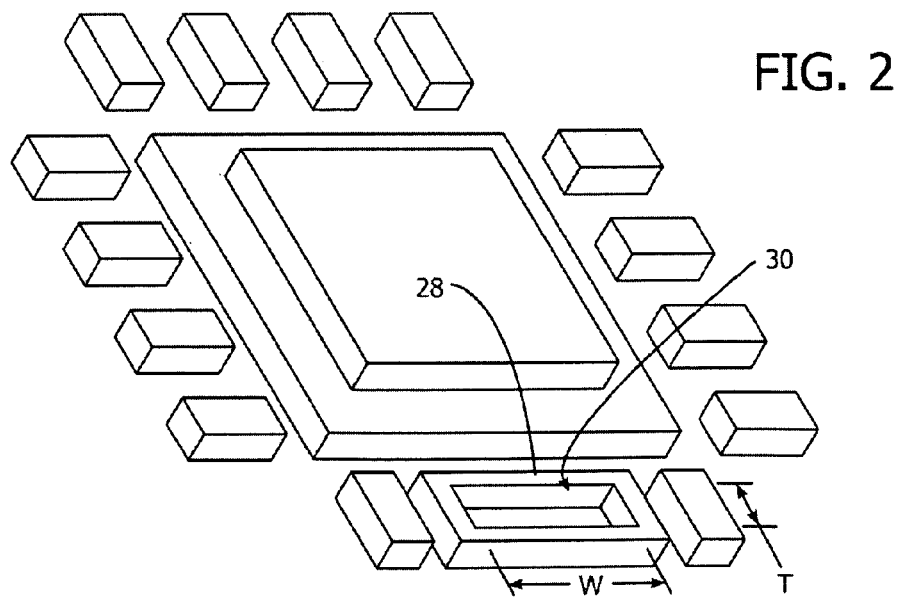
FIG. 2 is an isometric view of the leadframe assembly of FIG. 1 having a "tub" formed in a portion thereof.

As shown in FIG. 2, the contact 28 is processed to include a recess-like "tub" 30 having, in the disclosed embodiment, an approximate or general parallelepiped or prismatic form having a side-to-side width W and across the tub dimension T. In the various figures, the tub 30 is shown in a geometrically idealized form with straight lines that intersect at edges to define flat parallel planes and to define corners and vertices without substantial radii; in practice, the tub, which can also be characterized as a pocket, groove, recess, or trench, differs from the idealized form shown depending upon the manufacturing process and design constraints. In the case of the preferred embodiment, tub 30 is formed with a depth that is about one-half the total thickness of the leadframe; a representative leadframe thickness is currently about eight mil (0.008 inch) with tub depth of about four mil (0.004 inch) preferred. In those cases where the leadframe is fabricated by etching techniques, the tub 30 can be implemented by a conventional half-etch techniques.

Figure 3A:
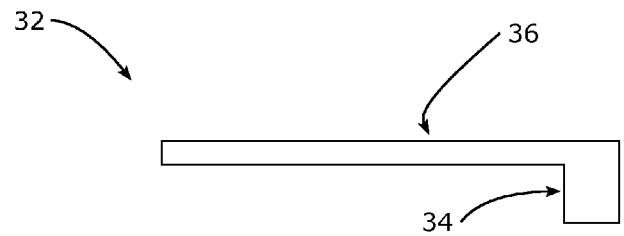
FIGS. 3a and 3b are side and bottom views, respectively, of a clip structure.
Figure 3B:
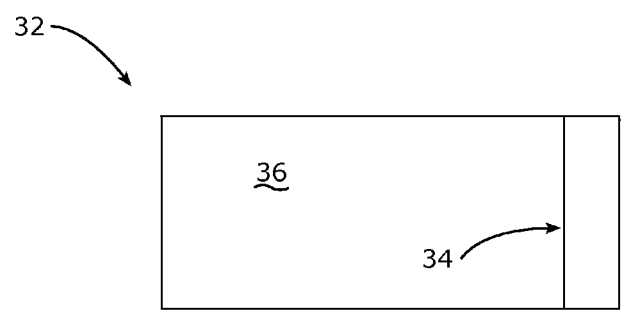

FIGS. 3a and 3b are side elevational and bottom views of a conductive "clip" 32 that is designed to be mated with the leadframe structure of FIG. 2 to provide a high-current capacity connection between the die 24 and the contact 28 of the leadframe. The clip 32 is typically fabricated from copper or a copper alloy and, in the case of the embodiment shown, includes a rectangular columnar part 34 and a cantilever bridge 36. As shown, the columnar part 34 has a side-to-side width W' and a thickness dimension T'.

Figure 4:
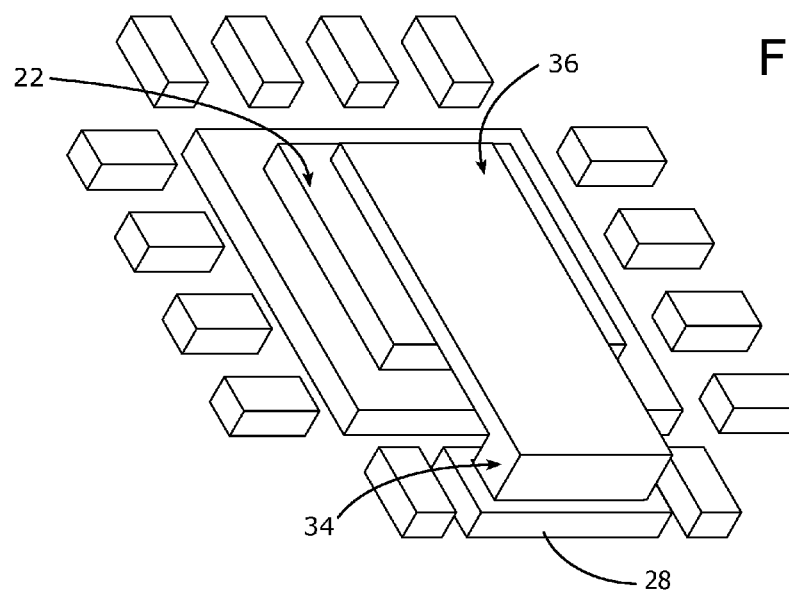
FIG. 4 is an isometric view of the leadframe assembly of FIG. 1 having the clip structure of FIGS. 3a and 3b installed in the "tub"

As shown in FIG. 4, the clip 32 is mated to the leadframe and the die by inserting the columnar part 34 into the tub 30 using, if desired, an adhesive or adherent solder-paste to secure the parts together. In addition, the parts can be so dimensioned that the columnar part 34 can be inserted into the tub 30 with a line-to-line fit. The cantilevered bridge 36 overlies the top surface of the die 24 and is attached thereto by conventional connection techniques including the use of a solder paste or an adhesive solder paste. Sometime after placement of the clip 32, the assemblage can be subject to a solder reflow step to electrically connect and mechanically secure the parts together; the use of the tub 30 increases the probability that the clip 32 will remain in place during subsequent processing until such time that the solder reflow step is completed.

The clip 32 is designed to conduct substantial current from the die 22 to the contact 28; in the embodiment shown in FIG. 4, the die 22 can take the form of a power-switching or power-handling FET.

Figure 5A:
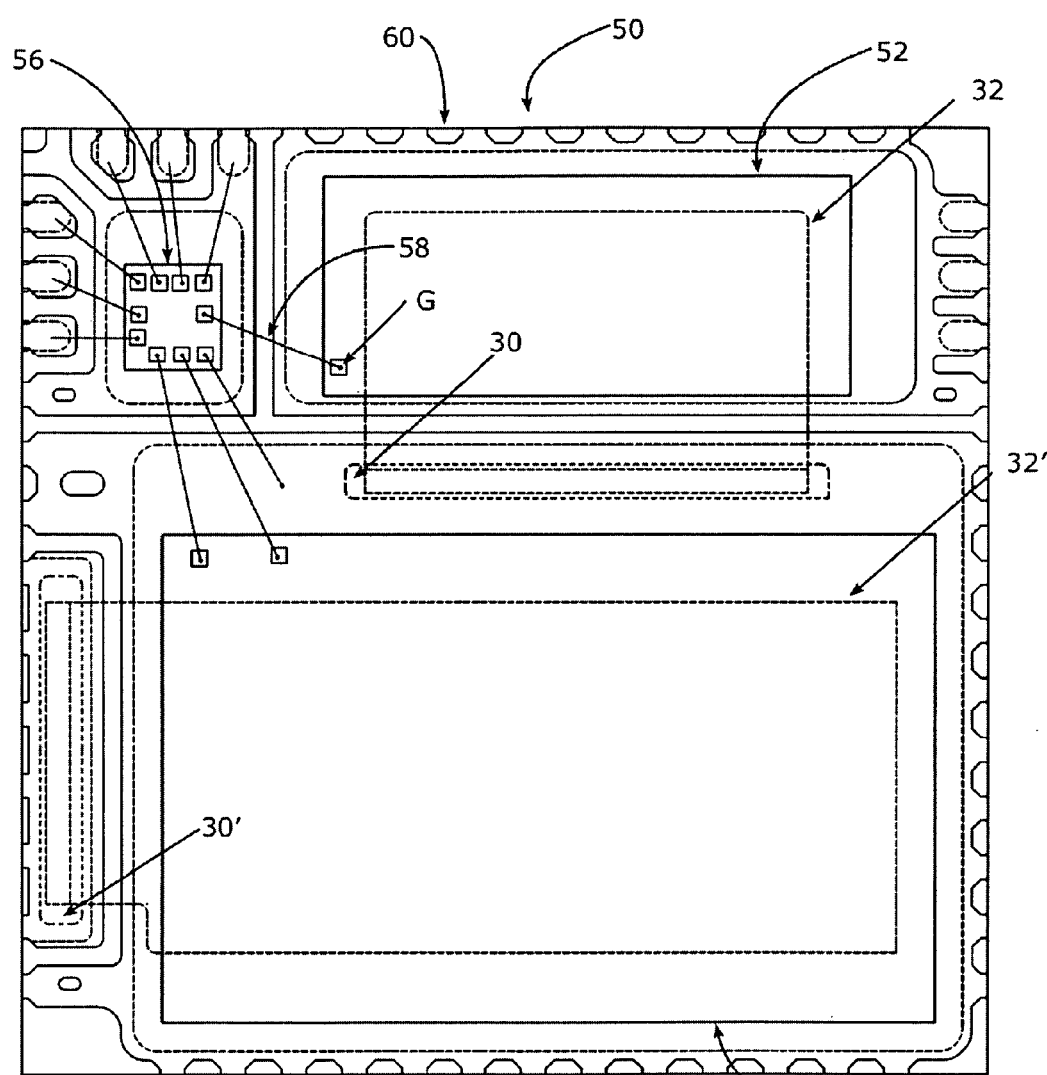
FIGS. 5a and 5b are a plan view and a side-elevational view of an example embodiment in which two separate devices thereof have an associated clip structure.
Figure 5B:
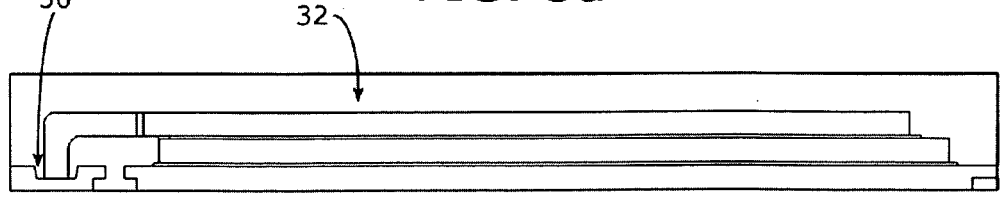
Figure 5C:
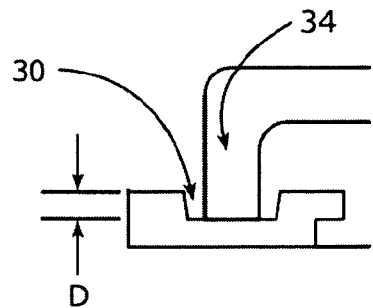
FIG. 5c is an enlarged view of the left portion of FIG. 5b.

FIGS. 5a, 5b, and 5c illustrate a preferred embodiment of a circuit assembly 50 consistent with the concept shown in FIGS. 2-4. As shown, the circuit assembly 50 includes first and second FETs 52 and 54 (e.g., MOSFETs) and a controller or driver chip 56 that is connected via bonding wires 58 between conductive pads (unnumbered) on the chip 56 to contacts 60 of the leadframe. While each FET die 52/54 is mounted on a respective leadframe in FIG. 5a, both respective leadframes constitute a leadframe collectively for the chip assembly.

As shown in FIG. 5a, the first FET 52 is mounted on the portion of the leadframe to the right of the driver chip 56 with a bonding wire 58 connecting a gate G to the driver chip 56. In a similar manner, the second FET 54 is mounted on the portion of the leadframe below the first FET 52 and the driver chip 56 with bonding wires connecting terminals thereon to the driver chip 56.

As shown, a first clip 32 has a first portion in contact with the upper surface of the die 52 with its columnar portion inserted into or received within in a tub 30. In a similar manner, another clip 32' has a first portion in contact with the upper surface of the die 54 with its columnar portion inserted into or received within a tub 30'.

In the embodiment of FIG. 5a, each FET die 52/54 is mounted on a respective leadframe with the clip 32 of the FET die 52 connecting the die 52 to a tub 30 formed in the leadframe of the FET die 54; this arrangement effecting a series-circuit connection between the FETs 52/54 useful for synchronous buck converter circuits in which connection by the clip 32 of the FET die 52 the tub 30 formed in the leadframe of the FET die 54 functions as a phase node. In the case where each FET 52/54 is a n-channel MOSFET, the drain of one of the MOSFETs is connected to the source of the other MOSFET through the clip 32. As can be appreciated, both clips 32 and 32' serve as substantial current carrying conductors where the FETs 52 and 54 have power-switching or power-control functionality.

As shown in FIG. 5b, the transition between the columnar part and the cantilever bridge part can be formed as a smooth radiused bend in contrast to the rectilinear features of the clip shown in FIGS. 3 and 3a. As shown in FIG. 5c, the tub 30 has a depth "D" dimension about one-half the thickness of the leadframe, e.g., about four mil (0.004 inch) where the leadframe has a thickness of about eight mil (0.008 inch). As also shown in FIG. 5c, that portion of the columnar part that is received within the tub 30 substantially occupies or extends along the depth "D" dimension of the tub 30.

Figure 6A:
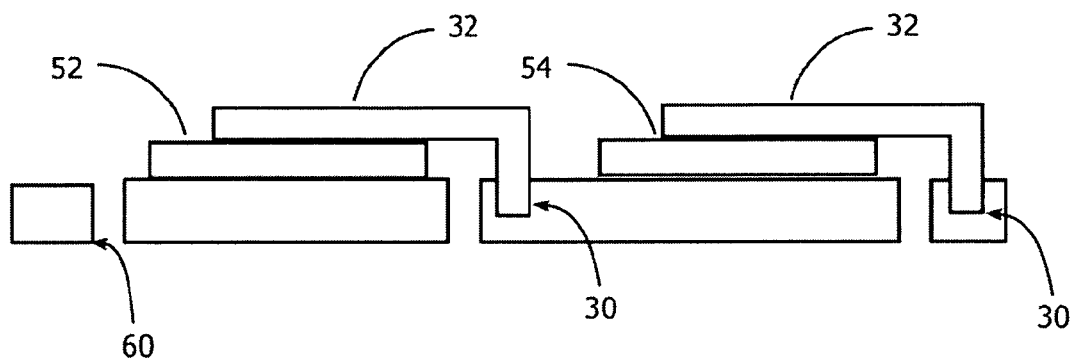
FIGS. 6a and 6b are side elevational views and a top view of two separate devices thereof each having an associated clip structure and organized differently from that of FIGS. 5a and 5b.
Figure 6B:
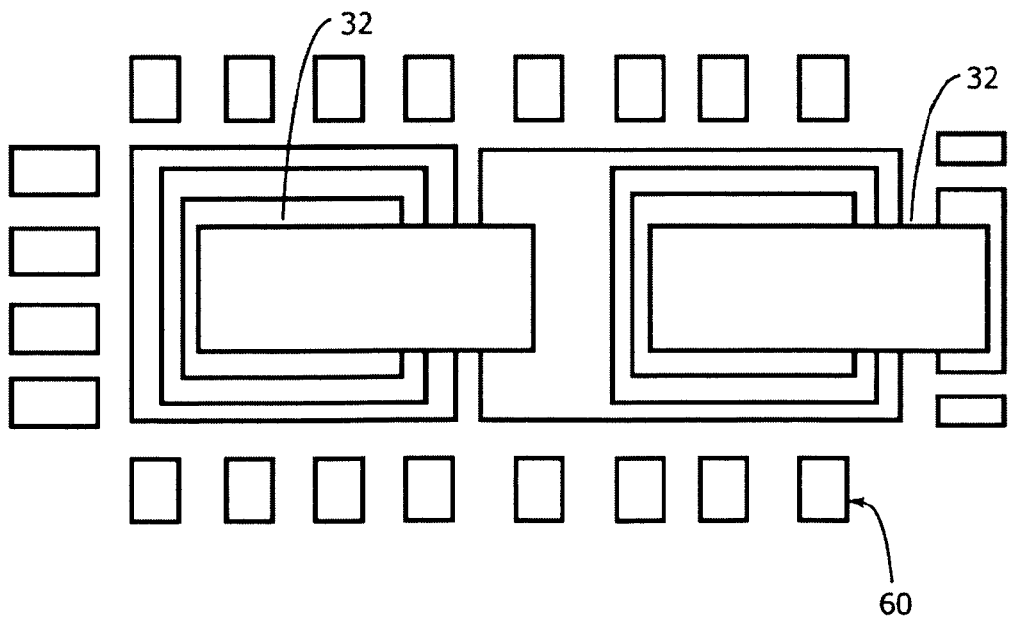

FIGS. 6a and 6b are side elevational views and a top view of two separate devices thereof each having an associated clips 32 in which the chip structures are "in-line" relative to the layout of FIGS. 5a and 5b.

The embodiment shown in FIGS. 5 and 6 are QFN "no-lead" type organizations; as can be appreciated, the invention is not so limited and can be used in the context of other types of semiconductor packages.

The use of a tub 30 (which also can be characterized as a pocket, groove, recess, or trench) functions to beneficially contain the solder paste used to initially retain the clip in place prior to the reflow step in contrast to prior art arrangements in which the solder paste is on an essentially planar surface and subject to migration away from the area in which it is initially deposited. The tub 30 thus provides a functional benefit with regard to solder-paste control prior to solder reflow and containment of the solder during the solder reflow step.

As will be apparent to those skilled in the art, various changes and modifications may be made to the illustrated embodiment of the present invention without departing from the spirit and scope of the invention as determined in the appended claims and their legal equivalent.

The invention claimed is:

1. A structural organization for electrically interconnecting a portion of a first semiconductor die to a leadframe electrically connected to a second portion of a second semiconductor die, comprising:
   a first leadframe having a first die attached thereto and having a plurality of electrical contacts associated therewith,
   a second leadframe having a second die attached thereto and having a plurality of electrical contacts associated therewith, said second leadframe having a thickness dimension associated therewith and having a recess-like tub formed therein; and
   an electrically conductive clip having first and second portions, a one of said first and second portions electrically connected to a portion of the first die and the other of said first and second portions mechanically received within said tub of said second leadframe.

2. The structural organization of claim 1, wherein said electrically conductive clip includes a columnar part received within the tub.

3. The structural organization of claim 2, wherein said a columnar part has a width dimension W' and a thickness dimension T' and said tub has a dimension W corresponding to and larger than said width dimension W' and a dimension corresponding to and larger said thickness dimension T'.

4. The structural organization of claim 3, wherein said tub has a depth dimension about one-half the thickness of the leadframe.

5. The structural organization of claim 2, wherein said electrically conductive clip includes a bridge connected to said columnar part, the bridge part connected to said die.

* * * * *